US010323316B2

(12) United States Patent
Bucci

(10) Patent No.: US 10,323,316 B2
(45) Date of Patent: Jun. 18, 2019

(54) MULTI-MASK ALIGNMENT SYSTEM AND METHOD

(71) Applicant: Advantech Global, LTD, Tortola (VG)

(72) Inventor: Brian Arthur Bucci, Pittsburgh, PA (US)

(73) Assignee: Advantech Global, LTD, Tortola (VG)

( * ) Notice: Subject to any disclaimer, the term of this patent is extended or adjusted under 35 U.S.C. 154(b) by 0 days.

(21) Appl. No.: 15/518,506

(22) PCT Filed: Oct. 14, 2015

(86) PCT No.: PCT/US2015/055517
§ 371 (c)(1),
(2) Date: Apr. 12, 2017

(87) PCT Pub. No.: WO2016/061215
PCT Pub. Date: Apr. 21, 2016

(65) Prior Publication Data
US 2017/0233861 A1 Aug. 17, 2017

Related U.S. Application Data

(60) Provisional application No. 62/065,291, filed on Oct. 17, 2014.

(51) Int. Cl.
*C23C 14/04* (2006.01)

(52) U.S. Cl.
CPC ................... *C23C 14/042* (2013.01)

(58) Field of Classification Search
CPC .................................................. C23C 14/042
See application file for complete search history.

(56) References Cited

U.S. PATENT DOCUMENTS

| 6,475,287 | B1 | 11/2002 | Clark |
| 2002/0062785 | A1* | 5/2002 | Kim ...................... C23C 14/042 118/504 |
| 2002/0102754 | A1* | 8/2002 | Fujimori ............... C23C 14/042 438/22 |
| 2003/0098124 | A1* | 5/2003 | Clark .................... C23C 14/042 156/751 |
| 2004/0003775 | A1 | 1/2004 | Kim |
| 2006/0086321 | A1 | 4/2006 | Brody et al. |
| 2008/0042543 | A1 | 2/2008 | Conrad |
| 2012/0237682 | A1* | 9/2012 | Hong .................... C23C 14/042 427/282 |
| 2013/0236287 | A1 | 9/2013 | Tamura |
| 2014/0077431 | A1* | 3/2014 | Weaver ................. C23C 14/042 269/14 |

* cited by examiner

*Primary Examiner* — Joseph A Miller, Jr.
(74) *Attorney, Agent, or Firm* — The Webb Law Firm

(57) ABSTRACT

In a multi-mask alignment system and method, a carrier frame is provided having a number of apertures therethrough. A number of shadow mask-frame combinations are also provided. Each shadow mask-frame combination includes a first set of alignment features and each shadow mask-frame combination is positioned on a first side of the carrier with the frame supporting the shadow mask in alignment with one of the apertures. An alignment system is provided and a control system including a programmed controller is also provided. Under the control of the controller, the alignment system is caused to adjust the position of each shadow mask-frame combination with respect to the carrier based on positions of the first set of alignment features determined by the controller.

8 Claims, 13 Drawing Sheets

MULTI-MASK ALIGNMENT SYSTEM AND METHOD

CROSS REFERENCE TO RELATED APPLICATION

This application is the United States national phase of International Application No. PCT/US2015/055517 filed Oct. 14, 2015, and claims priority to U.S. Provisional Patent Application No. 62/065,291 filed Oct. 17, 2014, the disclosures of which are hereby incorporated in their entirety by reference.

BACKGROUND OF THE INVENTION

Field of the Invention

The present invention relates to a system and method for forming an effectively larger area shadow mask out of a number of smaller area shadow masks.

Description of Related Art

In the field of shadow mask vapor deposition, there is a trend to utilize increasingly larger area shadow masks that include one or more openings corresponding to a desired pattern of material to be deposited on a substrate from a deposition source. A problem, however, with forming increasingly larger area sized shadow masks is in avoiding run-on errors in positioning of openings across the dimensions of the shadow mask. Stated differently, a problem with forming increasingly larger area sized shadow masks is that it becomes increasingly more difficult to maintain accurate dimensional stability between openings used for depositing patterns of material on a substrate across the dimensions of the shadow mask.

SUMMARY OF THE INVENTION

Various preferred and non-limiting examples or aspects of the present invention will now be described and set forth in the following numbered clauses:

Clause 1: A multi-shadow mask alignment system comprises: a carrier including a plurality of apertures therethrough. Each aperture has associated therewith: a combination frame and shadow mask positioned on a first side of the carrier with the frame supporting the shadow mask in alignment with the aperture; an alignment system positioned on a second side of the carrier opposite the first side and operative for adjusting a position of the combination frame and shadow mask with respect to the carrier; and a control system including a programmed controller coupled to the alignment system, the controller operative for controlling the alignment system to fine or precision align the combination frame and shadow mask based on a position determined by the control system of each of a first set of alignment features of the combination frame and shadow mask.

Clause 2: The alignment system of clause 1, wherein the control system can include a digital camera coupled to the controller. The camera can be positioned to a side of the combination frame and shadow mask opposite the carrier. The camera can be operative for acquiring and forwarding digital images including the first set of alignment features to the controller which can be operative for processing the digital images and, based on the processed digital images, for causing the alignment system to fine or precision align the position of the combination frame and shadow mask so that the first set of alignment features are aligned to a predetermined set of coordinates stored in a memory of the controller.

Clause 3: The alignment system of clause 1 or 2 can further include an alignment substrate positioned to a side of the combination frame and shadow mask opposite the carrier. The alignment substrate can include a second set of alignment features. The control system can include a digital camera coupled to the controller and positioned to a side of the alignment substrate opposite the combination frame and shadow mask. The camera can be operative for acquiring and forwarding digital images, including the first and second sets of alignment features, to the controller which can be operative for processing the digital images and, based on the processed digital images, cause the alignment system to fine or precision align the position of the combination frame and shadow mask to align the first and second sets of alignment features.

Clause 4: The alignment system of any of clauses 1-3, wherein the carrier can include a second set of alignment features. The control system can include, for each aperture, a plurality of light source-light receiver pairs. Each light source-light receiver pair can define therebetween a light path. One alignment feature of the first set of alignment features and one alignment feature of the second set of alignment features can be positioned in each light path. The controller can be operative for processing the outputs of the light receivers and, based on the processed outputs of the light receivers, for causing the alignment system to fine or precision align the position of the combination frame and shadow mask to align the one alignment feature of the first set of alignment features and the one alignment feature of the second set of alignment features in each light path.

Clause 5: The alignment system of any of clauses 1-4, wherein: the alignment system can be operative for adjusting positions of a plural number of combination frames and shadow masks; and/or the controller can be operative for causing the alignment system to align a plural number of combination frames and shadow masks.

Clause 6: The alignment system of any of clauses 1-5, wherein the alignment system can be operative for adjusting the position of the combination frame and shadow mask in two or more of X, Y and θ directions. The X and Y directions can be parallel to the first side of the carrier. The θ direction can be rotational around a Z direction which can be normal to the first side of the carrier.

Clause 7: The alignment system of any of clauses 1-6, wherein the frame can include the first set of alignment features.

Clause 8: The alignment system of any of clauses 1-7, wherein each alignment feature can be one of the following: a visual mark or a hole.

Clause 9: The alignment system of any of clauses 1-8, wherein the alignment substrate can be transparent.

Clause 10: A multi-mask alignment method comprises: (a) providing a carrier having a plurality of apertures therethrough; (b) providing plural shadow mask-frame combinations, wherein each shadow mask-frame combination includes a first set of alignment features, each shadow mask-frame combination positioned on a first side of the carrier with the frame supporting the shadow mask in alignment with one of the apertures; (c) providing an alignment system; (d) providing a control system including a programmed controller; and (e) under the control of the controller, causing the alignment system to automatically adjust the position of each shadow mask-frame combination with respect to the carrier based on positions of the first set of alignment features for each shadow mask-frame combination determined by the controller.

Clause 11: The method of clause 10 can further include (f) following step (e), securing each shadow mask-frame combination to the carrier.

Clause 12: The method of clause 10 or 11 can further include (g) following step (f), performing vapor deposition through each shadow mask.

Clause 13: The method of any of clauses 10-12, wherein the control system can include a digital camera positioned on the first side of the carrier. Step (e) can include causing the alignment system to automatically adjust the position of each shadow mask-frame combination based on images of the at least one shadow mask-frame combination acquired from the camera by the controller such that the first set of alignment features are aligned to a predetermined set of coordinates stored in a memory of the controller.

Clause 14: The method of any of clauses 10-13 can further include providing an alignment substrate including a second set of alignment features on a side of the plural shadow mask-frame combinations opposite the carrier. Step (e) can include causing the alignment system to automatically adjust the position of each shadow mask-frame combination to align the first set of alignment features of each shadow mask-frame combination and the second set of alignment features of the alignment substrate.

Clause 15: The method of any of clauses 10-14, wherein the control system can further include one of the following: a digital camera operative for acquiring and forwarding digital images of the first and second sets of alignment features to the controller for processing during step (e); or plural light source-light receiver pairs, wherein each said pair defines a light path, wherein one alignment feature of the first set of alignment features and one alignment feature of the second set of alignment features are positioned in each light path, and the controller can be operative for processing the outputs of the light receivers during step (e).

Clause 16: The method of any of clauses 10-15, wherein each alignment feature can be one of the following: a visual mark or a hole.

Clause 17: The method of any of clauses 10-16, wherein the alignment substrate can be transparent.

Clause 18: The method of any of clauses 10-17, wherein the alignment system is provided on a second side of the carrier.

DESCRIPTION OF THE INVENTION

Figure 1:
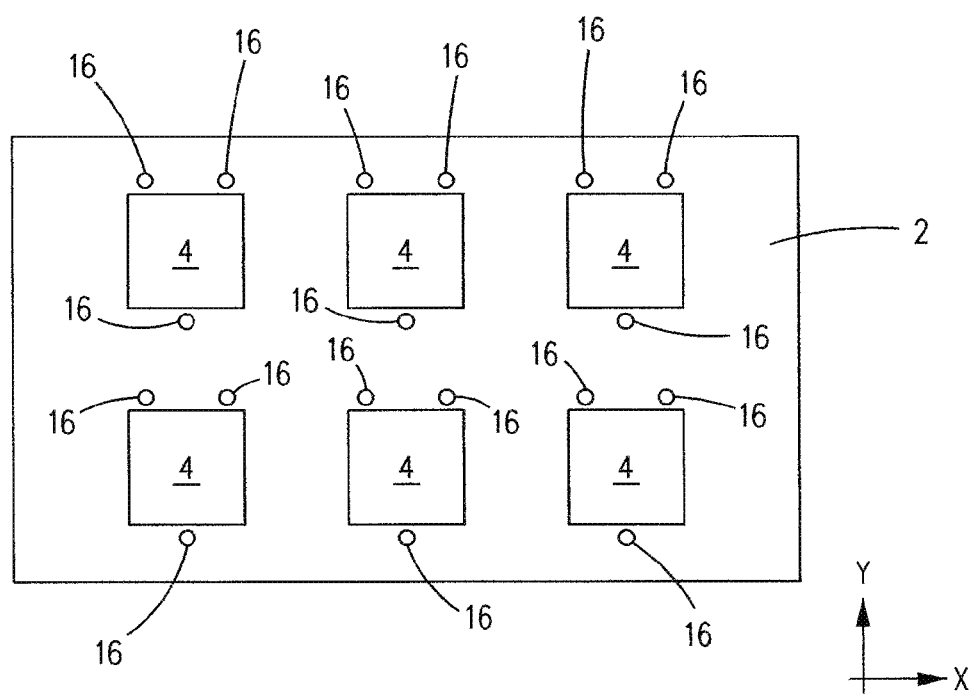
FIG. 1 is a schematic plan view of a carrier frame of a multi-shadow mask alignment system.

Various non-limiting examples will now be described with reference to the accompanying figures where like reference numbers correspond to like or functionally equivalent elements.

The various example multi-mask alignment systems described herein enable construction of an effectively larger area shadow mask out of a number of smaller area shadow masks. By constructing the effectively larger area shadow mask out of smaller area shadow masks, it is possible to maintain greater geometrical precision of the holes and apertures in the smaller shadow masks over a larger area, e.g., over an area larger than each smaller shadow mask alone. Since each small shadow mask is independent of the other small shadow masks, it is also possible to properly size the holes and apertures of each small shadow mask without affecting the dimensions of the other small shadow mask.

The various example multi-mask alignment systems described herein provide for aligning a number of small area shadow masks (one, or two, or more at a time; or all simultaneously) to form an effectively larger area shadow mask. There is no specific limit to the number of small shadow masks that can be used to form the effectively larger shadow mask.

The basic method of operation of each example multi-mask alignment system is to perform fine or precision alignment of each small shadow mask independent of each other small shadow mask. The alignment of each small shadow mask can be done with reference to alignment features associated with an alignment substrate, such as a glass plate, and alignment features associated with the small shadow masks; or by comparing alignment features associated with the small shadow masks with predetermined coordinates stored in a memory of a controller using a coordinate measuring machine (CMM) approach.

If utilizing the CMM approach, the alignment features on the small shadow masks, positioned in coarse (or general) alignment on a carrier frame, are compared to the predetermined coordinates stored in a memory of the controller. The coordinates can be stored in, for example, a drawing file, such as a CAD file, or in any suitable and/or desirable file type that facilitates the controller acquiring digital images of the small shadow masks via one or more digital (CCD) cameras and comparing the alignment features in the acquired digital images of the small shadow masks to the predetermined coordinates stored in the memory of the controller. In an example, each predetermined coordinate can include a digital representation of the corresponding alignment feature acquired from an image, whereupon the controller aligns the alignment feature in an acquired image with the digital representation of the alignment feature. However, this is not to be construed in a limiting sense.

If using the alignment substrate approach, the alignment substrate is located in spaced relation above the small shadow masks, which are positioned in coarse (or general) alignment on the carrier frame, with a gap between the bottom of the alignment substrate and the top of the small shadow masks. One or more digital (CCD) cameras are positioned above the alignment substrate to acquire images of the alignment features on the shadow masks and the alignment features of the alignment substrate. In an example, the alignment features on the shadow masks and the alignment features of the alignment substrate can be complementary. For example, the alignment features of the alignment substrate can include a pattern of solid disk or circles while the alignment features of the small shadow mask can include a pattern of open holes or rings, each of which is larger than the corresponding disk or circle on the alignment substrate. Thus, alignment could be quantified by measuring the position of each disk or circle within a hole or ring.

If using the CCM approach, each small shadow mask includes alignment features. However, instead of comparing these alignment features to marks on the alignment substrate, the absolute coordinates of the alignment features on the small shadow masks can be compared to the predetermined coordinates for the alignment features stored in the file in the memory of the controller. In this way, the alignment features on each small shadow mask can be used to compute the alignment of the small shadow masks relative to each other.

During alignment using the alignment substrate approach or the CCM approach, a mask frame supporting each small shadow mask is lifted by pins of an alignment stage that is part of an alignment system positioned, in an example, below the carrier frame. The carrier frame includes holes, or apertures, or openings to allow the pins to pass through the carrier frame and perform this operation. Each small mask frame is lifted (in the Z direction) off the surface of the carrier frame high enough to allow motion in the X, Y and/or θ directions, but not high enough to contact the bottom of the alignment substrate, if present. When using the alignment substrate approach, alignment between alignment features of each small shadow mask and corresponding alignment features of the alignment substrate is performed. In the case of the CCM approach, contact with the alignment substrate is not of concern because it is not present. However, it is still desirable to only lift the mask frames a small distance to avoid measurement error.

Each small shadow mask and mask frame combination can be aligned independently of each other small shadow mask and frame combination. This may be accomplished by an alignment system that includes an alignment stage that aligns a number of small shadow masks and frames or by an alignment system that includes one alignment stage per small shadow mask and frame. The number of alignment stages utilized to align the small shadow masks is not to be construed in a limiting sense.

After fine or precision alignment of each small shadow mask and frame comprising the large shadow mask is complete, the small shadow masks and frames are lowered back to the carrier frame. If present, the alignment substrate can be removed. Finally, the fine or precision aligned mask frames can be bonded to the carrier frame by any suitable or desirable means, such as, without limitation, adhesive or welding.

A first example multi-mask alignment system will now be described with reference to FIGS. 1-5.

The first example multi-mask alignment system includes a carrier (or carrier frame) 2 (FIG. 1) having a plurality of apertures 4 therethrough. Associated with each aperture 4 is a frame 6 supporting a shadow mask 8 (FIGS. 2 and 3) which includes one or more apertures (not shown) therethrough in a pattern corresponding to a desired pattern of material(s) desired to be vapor deposited through said apertures in said shadow mask 8.

Figure 2:
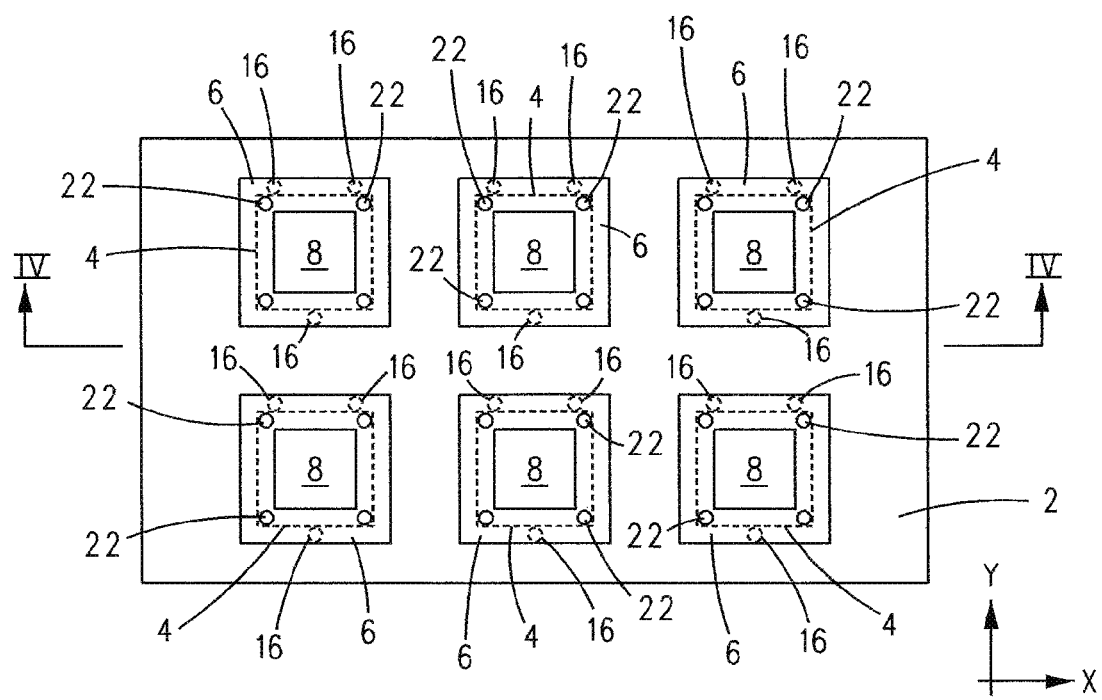
FIG. 2 is a schematic plan view of plural combination frames and shadow masks positioned on the carrier frame of FIG. 1, with each shadow mask positioned in alignment with an aperture in the carrier frame.
Figure 3:
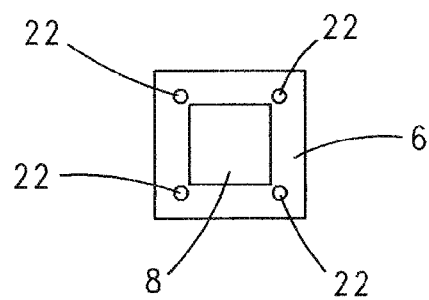
FIG. 3 is an isolated schematic plan view of a combination frame and shadow mask including a first set of alignment features.

In an example, carrier 2 supports six combination frames and shadow mask 6/8 on a first (top) side of carrier 2 with each frame 6 supporting its corresponding shadow mask 8 in alignment with an aperture 4 of carrier 2 (FIG. 2). In an example, each shadow mask 8 can have the same pattern of apertures, or a different pattern of apertures. In another example, two or more (but less than all) of shadow masks 8 can have the same pattern of apertures while the remaining shadow mask(s) can have a different pattern of apertures. Each shadow mask 8 having the same or different pattern of apertures than the other shadow masks 8 is not to be construed in a limiting sense.

Initially, each combination frame and shadow mask 6/8 is positioned on carrier 2 in coarse, rough, or general alignment with the corresponding aperture 4 of carrier 2.

Figure 4:
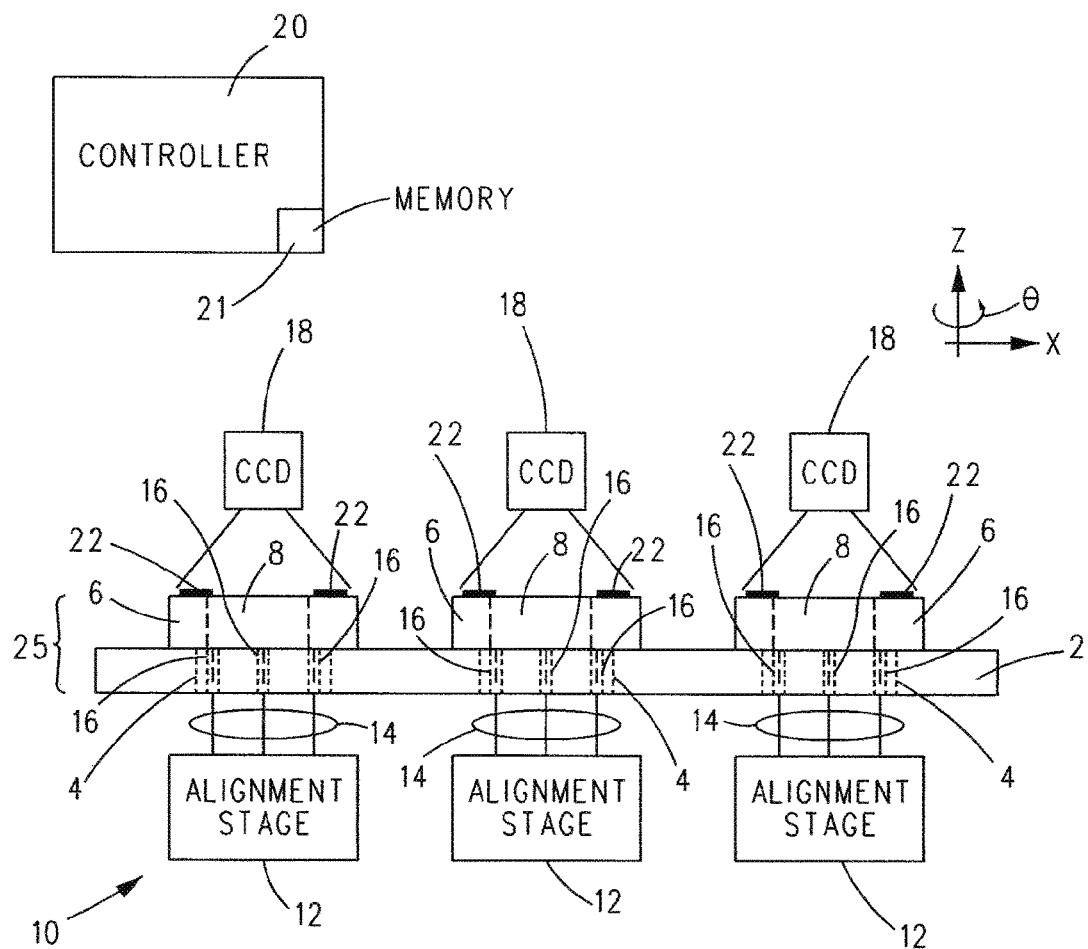
FIG. 4 is a schematic side view taken along lines IV-IV in FIG. 2 of the carrier frame including three combination frames and shadow masks in contact with the carrier frame, and further including a schematic of an alignment system including one or more alignment stages positioned below the carrier frame and three digital (CCD) cameras positioned above the three combination frames and shadow masks.
Figure 5:
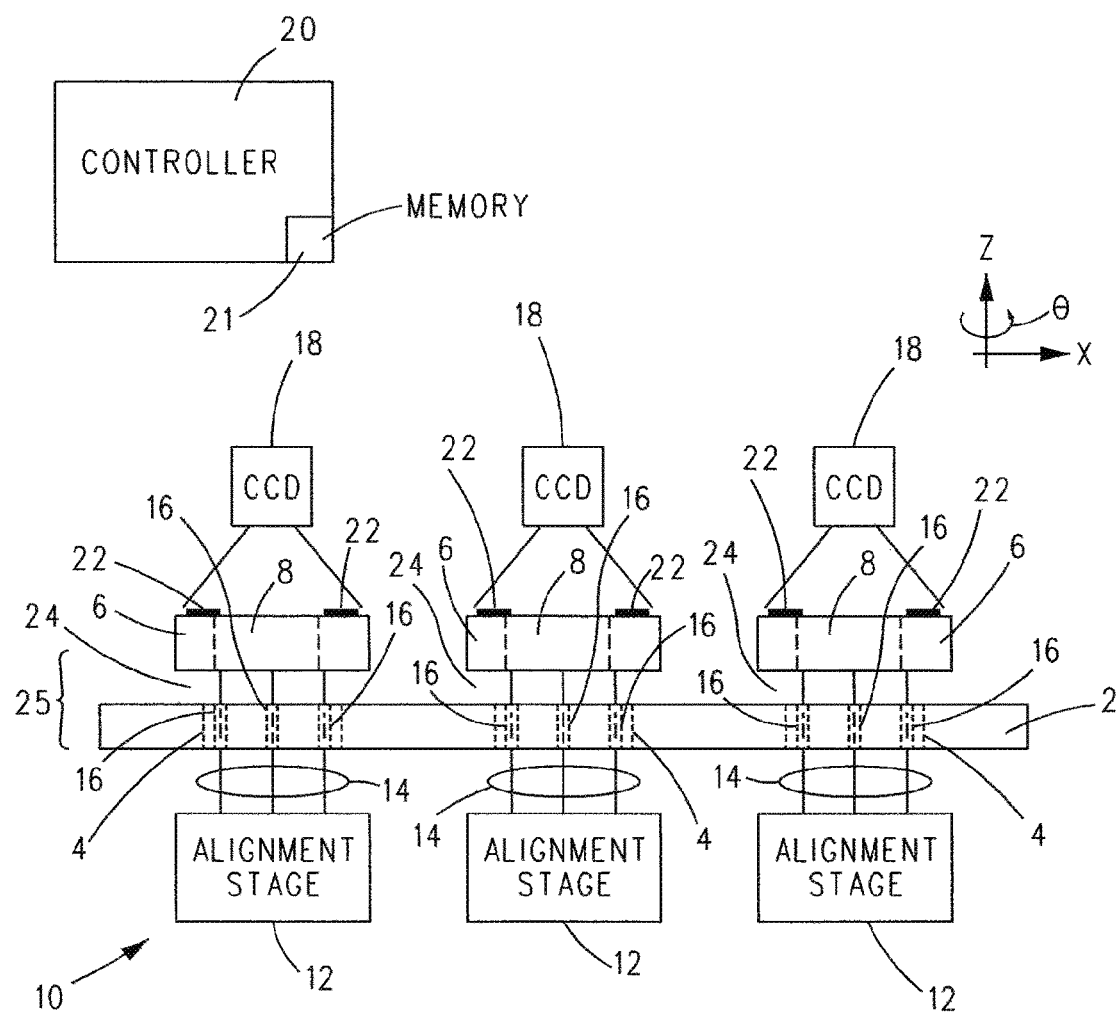
FIG. 5 is a view of the multi-mask alignment system shown in FIG. 4 with the three combination frames and shadow masks lifted above the top surface of the carrier frame via pins of the alignment stage(s) of the alignment system.

As shown in FIGS. 4 and 5, the first example multi-shadow mask alignment system includes an alignment system 10 positioned on a second (bottom) side of carrier 2 opposite the plural combination of frames and shadow masks 6/8 Alignment system 10 can include one or more alignment stages 12 as deemed suitable and/or desirable for fine positioning each combination frame and shadow mask 6/8 in the manner described hereinafter. In an example, each aperture 4 can include a dedicated alignment stage 12 for fine positioning the combination frame and shadow mask 6/8 positioned with its shadow mask 8 in alignment with said aperture 4. However, this is not to be construed as limiting since it is envisioned that each alignment stage 12 can be configured and operative to fine or precision align of any number combination frames and shadow masks 6/8. In an example, a single alignment stage 12 can be configured and operative for fine or precision aligning two or more combination frames and shadow masks 6/8 in the manner described hereinafter.

For the purpose of description, it will be assumed that there is a one-to-one correspondence between each combination frame and shadow mask 6/8 and a corresponding alignment stage 12. However, this is not to be construed in a limiting sense.

Each alignment stage 12 includes a number of elongated pins 14 that extend through holes 16 in carrier 2. In an example, three holes 16 (shown best in FIG. 1) surround each aperture 4. However, this is not to be construed in a limiting sense. Pins 14 extending through the holes 16 surrounding each aperture 4 contact the side of the frame 6 supporting the shadow mask 8 aligned with said aperture 4 facing carrier 2.

One or more digital (CCD) cameras 18 are positioned to a side of the plural combination frames and shadow masks 6/8 opposite carrier 2. In an example, each digital camera 18 is positioned to view a single combination frame and shadow mask 6/8. However, this is not to be construed in a limiting sense since it is envisioned that each digital camera 18 can be positioned and operative for viewing two, or more, or all of the combination frames and shadow masks 6/8. For the purpose of description, it will be assumed that there is a one-to-one correspondence between each combination frame and shadow mask 6/8 and digital camera 18. However, this is not to be construed in a limiting sense.

The multi-shadow mask alignment system also includes a programmed controller 20 coupled to each alignment stage 12 of alignment system 10 and each digital camera 18. The combination of controller 20 and digital cameras 18 define a control system of each example multi-mask alignment system described herein that includes digital cameras 18. Controller 20 is operative for controlling alignment system 10 and, more particularly, each alignment stage 12, to fine or precision align each combination frame and shadow mask 6/8 based on a position determined for a first set of alignment features 22 (shown best in FIG. 2) of the combination frame and shadow mask 6/8. In an example, frame 6 includes the first set of alignment features 22.

At a suitable time when it is desired to perform fine or precision alignment of a combination frame and shadow mask 6/8, controller 20 causes alignment stage 12 to extend pins 14 from the retracted position shown in FIG. 4 to the extended position shown in FIG. 5 whereupon the combination frame and shadow mask 6/8 is lifted from the first side of carrier 2 in the Z direction thereby defining a gap 24. The digital camera 18 positioned to the side of the combination frame and shadow mask 6/8 opposite carrier 2 acquires and forwards digital images, including the first set of alignment features 22, to controller 20 which is operative for processing the digital images and, based on the processed digital images, to control alignment stage 12 to fine or precision adjust the position of the combination frame and shadow mask 6/8.

More specifically, controller 20 is operative for processing the digital images, including the first set of alignment features 22, and, based on the processed digital images, to control alignment stage 12 to adjust the position of the combination frame and shadow mask 6/8 in the X, Y and/or θ directions such that the first set of alignment features are fine or precision aligned to a predetermined set of coordinates stored in a memory 21 of controller 20. This predetermined set of coordinates can be stored in memory 21 in any suitable or desirable format, including, for example, a drawing or CAD file. However, this is not to be construed in a limiting sense since it is envisioned that any suitable and/or desirable manner of storing the predetermined set of coordinates that controller 20 utilizes to align with the first set of alignment features 22 can be utilized.

In an example, controller 20 is programmed to identify the first set of alignment features 22 and their locations in an image acquired from digital camera 18 of the combination frame and shadow mask 6/8. Upon identifying the first set of alignment features 22 and their locations, controller causes alignment stage 12 to fine or precision align the first set of alignment features 22 to the predetermined coordinates stored in a file in memory 21 of controller 20. The alignment features 22 can be points, lines, contours, circles, rings, and/or any other suitable and/or desirable feature. The alignment of the first set alignment features 22 can be based on intensity of the first set of alignment features 22 or based on image features. In an example, controller can compare the first set of alignment features 22 in an acquired image to a predetermined set of alignment features at a predetermined set of coordinates stored in a digital reference or source image stored in memory 21 of controller 20. Absent alignment between the first set alignment features 22 and the predetermined set of alignment features of the reference or source image stored in memory 21, controller 20 can cause alignment stage 12 to move in the X, Y and/or θ directions as necessary in order to align the predetermined set of alignment features in the reference or source image to the first set of alignment features 22 in an image acquired of the combination frame and shadow mask 6/8 by digital camera 18. The particular manner in which the first set of alignment features 22 is compared to a predetermined set of coordinates stored in memory 21 of controller 20 is not to be construed as limiting since it is envisioned that such comparison can occur in any suitable and/or desirable manner now known or hereinafter developed.

More specifically, in order to perform fine or precision alignment of the first set of alignment features 22 to the predetermined set of coordinates stored in memory 21 after gap 24 is formed, controller 20 causes alignment stage 12 to move the combination frame and shadow mask 6/8, as necessary, in the X, Y and/or θ direction (clockwise or counterclockwise) around the Z direction. Once controller 20 has determined that the first set of alignment features 22 are fine or precision aligned to the predetermined set of coordinates stored in memory 21, controller causes alignment stage 12 to lower pins 14 thereby returning combination frame and shadow mask 6/8 from the position shown in FIG. 5 back to the position shown in FIG. 4, with frame 6 in contact to the first side of carrier 2. Thereafter, each combination frame and shadow mask 6/8 can be secured to carrier 2 in any suitable and/or desirable manner, such as, for example, adhesive or welding frame 6 to carrier 2, to form a finished assembly 25 comprising carrier 2 having a plurality of combination frames and shadow masks 6/8 secured thereto with each shadow mask 8 fine or precision aligned to each other combination frame and shadow mask 6/8 secured to carrier 2. In an example, the first set of alignment features and the predetermined set of alignment features can be complementary. However, this is not to be construed in a limiting sense.

Figure 8:
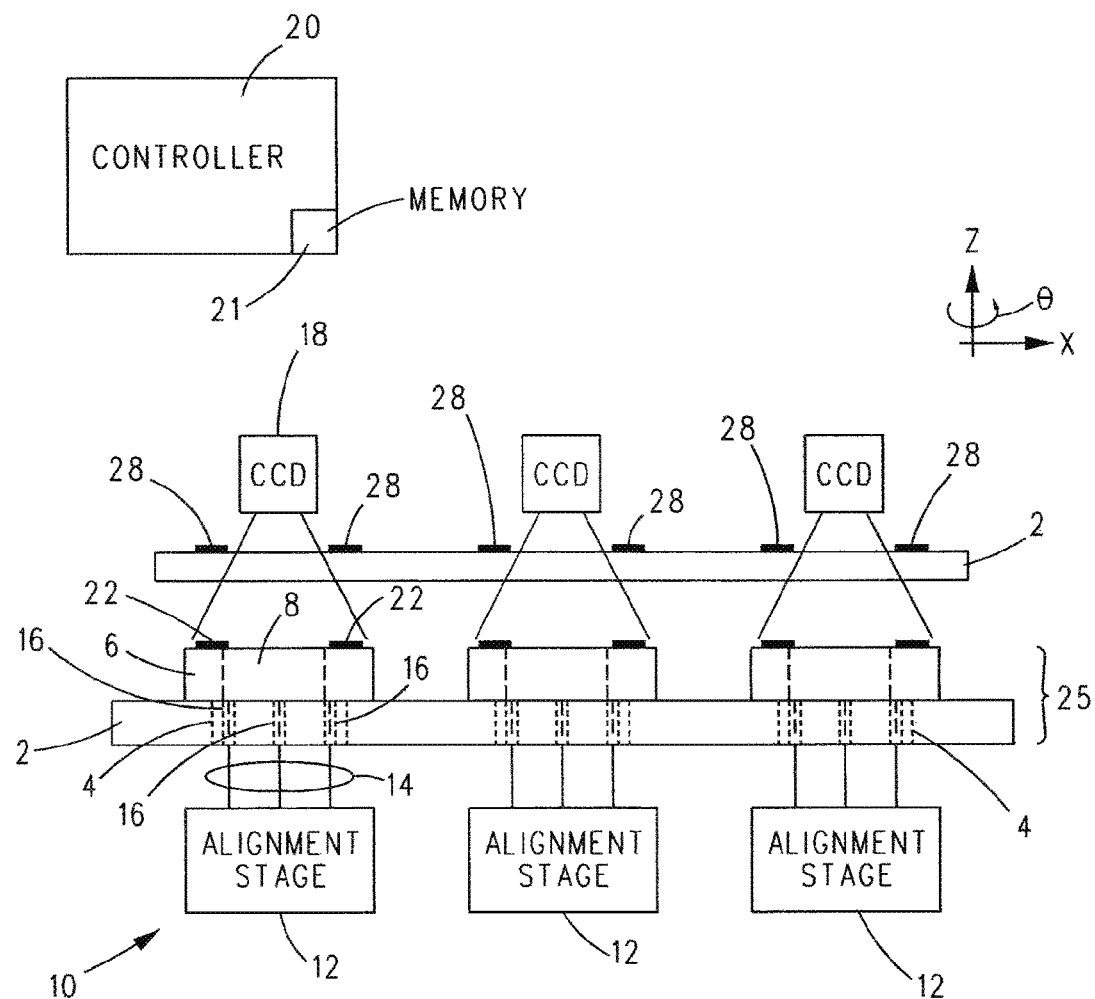
FIG. 8 is a schematic side view of the multi-mask alignment system shown in FIG. 4 including the alignment substrate of FIG. 7 positioned between the three digital cameras and the three combination frames and shadow masks.
Figure 9:
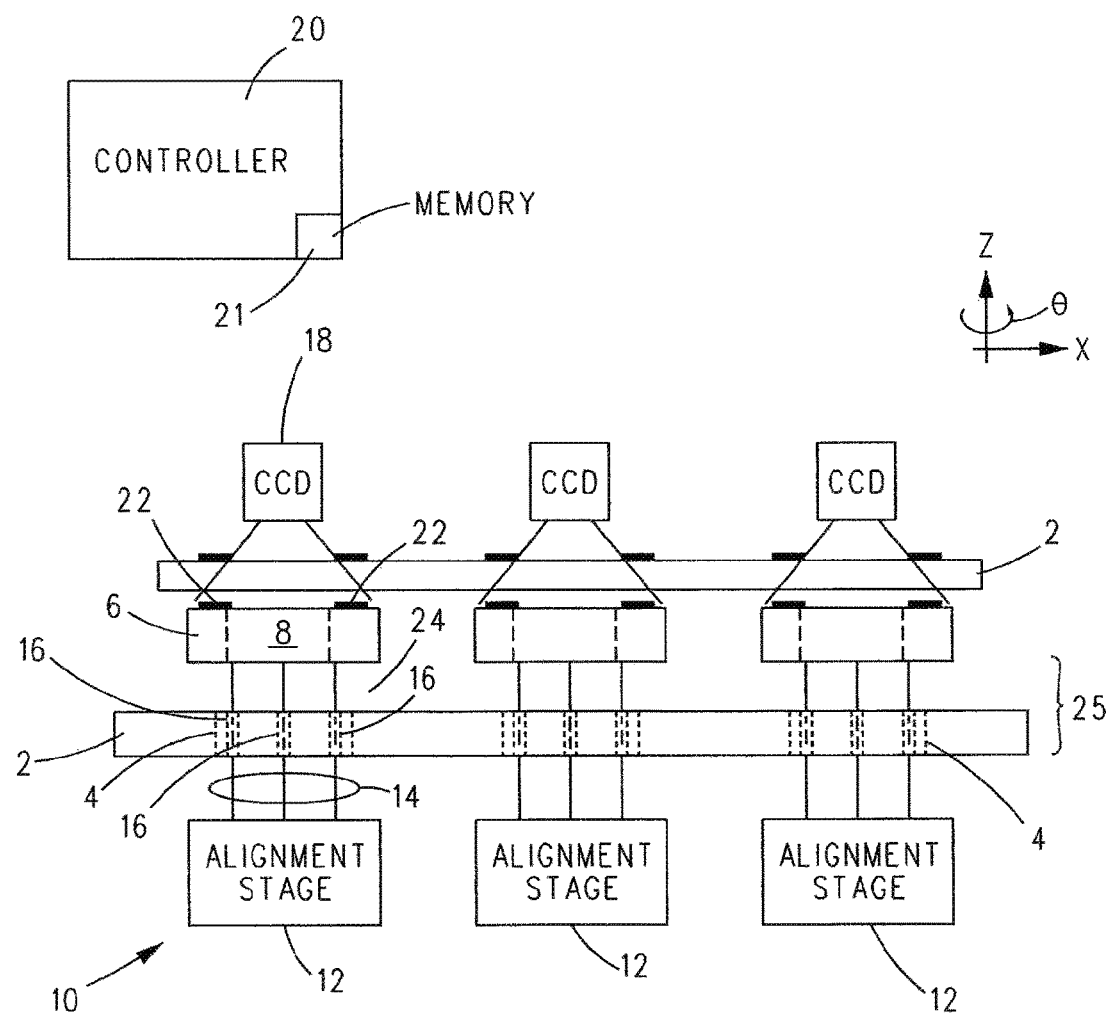
FIG. 9 is a view of the multi-mask alignment system shown in FIG. 8 with the three combination frames and shadow masks lifted above the top surface of the carrier frame via pins of the alignment stage(s) of the alignment system.
Figure 10:
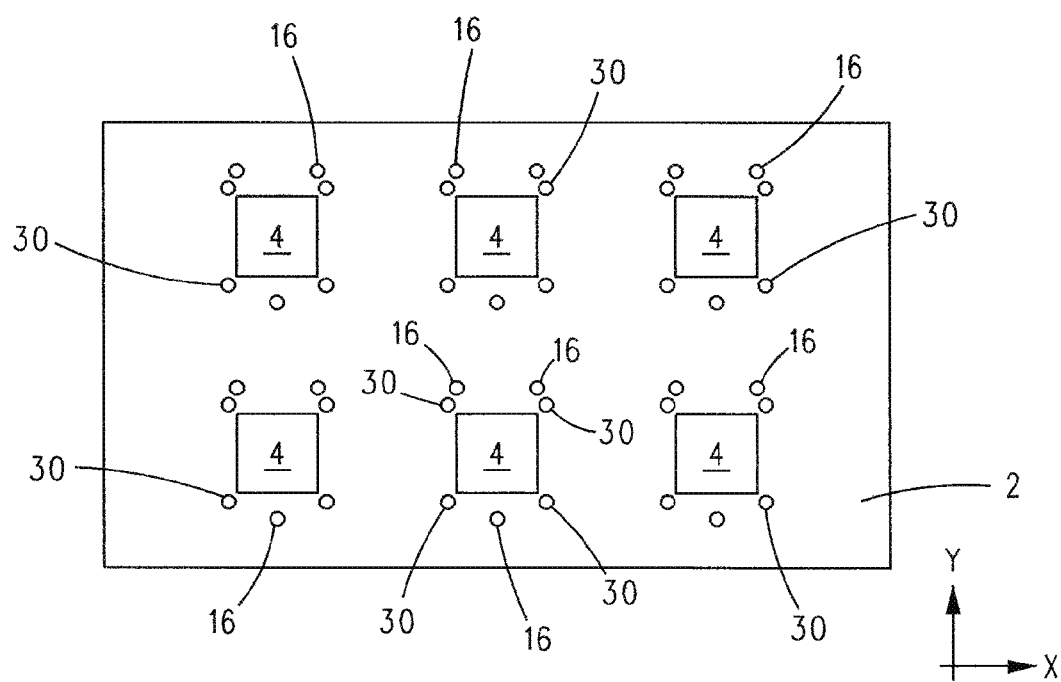
FIG. 10 is a plan view of another example carrier frame including a second set of alignment features (different than the second set of alignment features shown on the alignment substrate in FIG. 7)
Figure 11:
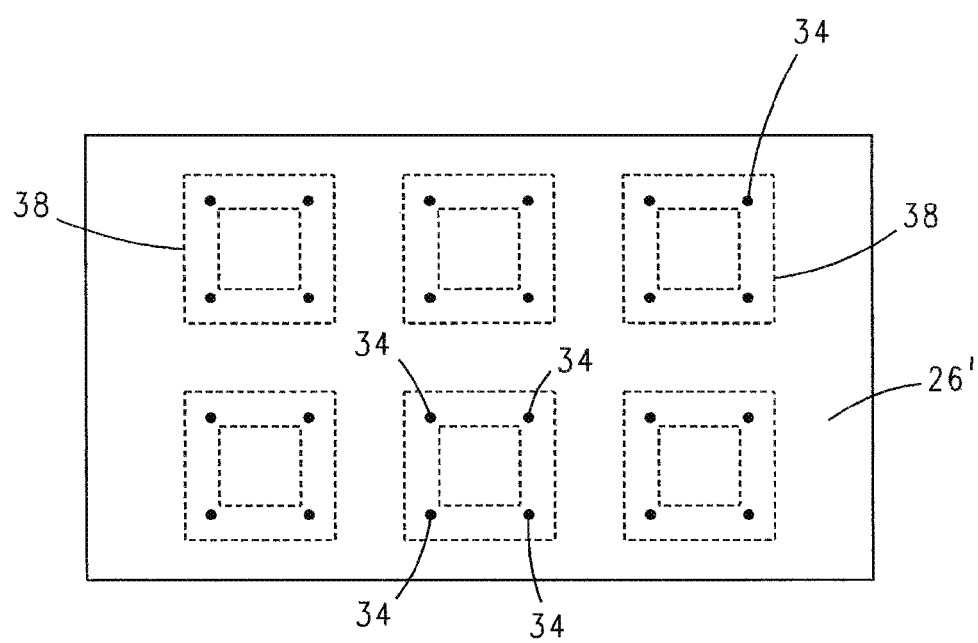
FIG. 11 is a plan view of an alignment substrate including a number of light receivers and optional support frames (shown in phantom) for supporting the light receivers on the alignment substrate.
Figure 12:
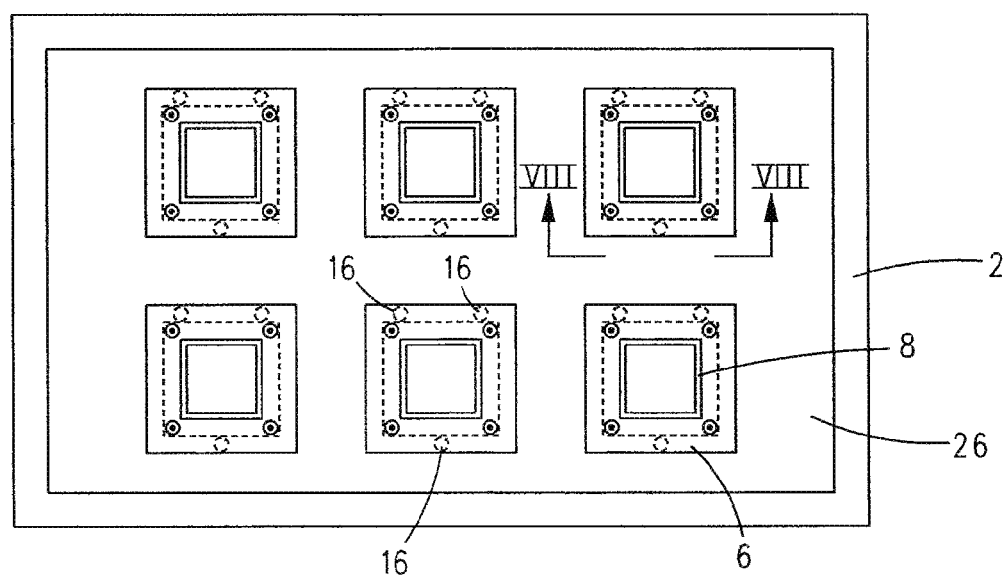
FIG. 12 is a plan view of the alignment substrate of FIG. 11 positioned over a plurality of combination frames and shadow masks disposed on the carrier frame shown in FIG. 10.

With reference to FIGS. 6-9 and with continuing reference to FIGS. 1-5, in a second example multi-mask alignment system, similar in many respects to the first example multi-mask alignment system of FIGS. 1-5, an alignment substrate 26 (FIG. 7) is positioned between digital cameras 18 and the plurality of combination frames and shadow masks 6/8 (FIGS. 8 and 9). In an example, alignment substrate 26 is transparent and is made of a material that has good dimensional stability, such as, for example, glass. Alignment substrate 26 includes a second set of alignment features 28 (shown best in FIG. 7) in a pattern corresponding to the pattern of the first set of alignment features 22 (shown, e.g., in FIG. 6) of the plural combination frames and shadow masks 6/8 positioned in coarse alignment on carrier 2.

In this example, each digital camera 18 is operative for acquiring and forwarding digital images, including the first and second sets of alignment features 22 and 28, to controller 20 which is operative for processing the digital images and, based on the processed digital images, to cause alignment system 10 to adjust the position of each combination frame and shadow mask 6/8 to fine or precision align the first and second set of alignment features 22 and 28.

For the purpose of description, it will be assumed that a single alignment stage 12 of alignment system 10 and a single digital camera 18 are utilized for fine or precision alignment of a single combination frame and shadow mask 6/8. However, this is not to be construed in a limiting sense.

At a suitable time, controller 20 causes alignment stage 12 to extend pins 14 from the retracted position shown in FIG. 8 to the extended position shown in FIG. 9 defining gap 24 between the first side of carrier 2 and the side of the combination frame and shadow mask 6/8 facing carrier 2.

Digital camera 18 positioned to the side of the combination frame and shadow mask 6/8 opposite carrier 2 acquires and forwards digital images, including the first and second sets of alignment features 22 and 28, to controller 20. Controller 20 is operative for processing the digital images and, based on the processed digital images, to cause alignment stage 12 to move in the X, Y and/or θ directions as necessary in order to fine or precision align the first and second sets of alignment features 22 and 28.

In this example, each frame 6 includes four alignment features 22 (FIG. 6) and alignment substrate 26 includes four alignment features 28 (FIG. 6) configured to be aligned with the four alignment features 22 of said frame 6. The number of first and second sets of alignment features 22 and 28 used for aligning each combination frame and shadow mask 6/8 is not to be construed in a limiting sense.

Figure 6:
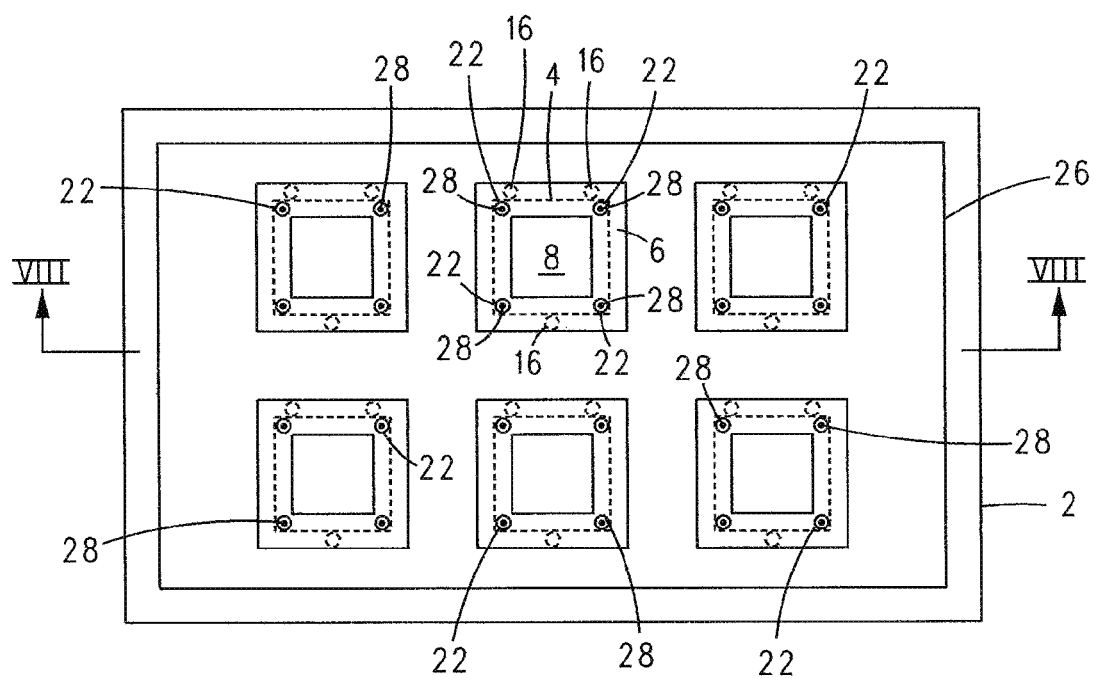
FIG. 6 is a schematic plan view of an alignment substrate positioned over the plural combination frames and shadow masks positioned on a carrier frame shown in FIG. 2.
Figure 7:
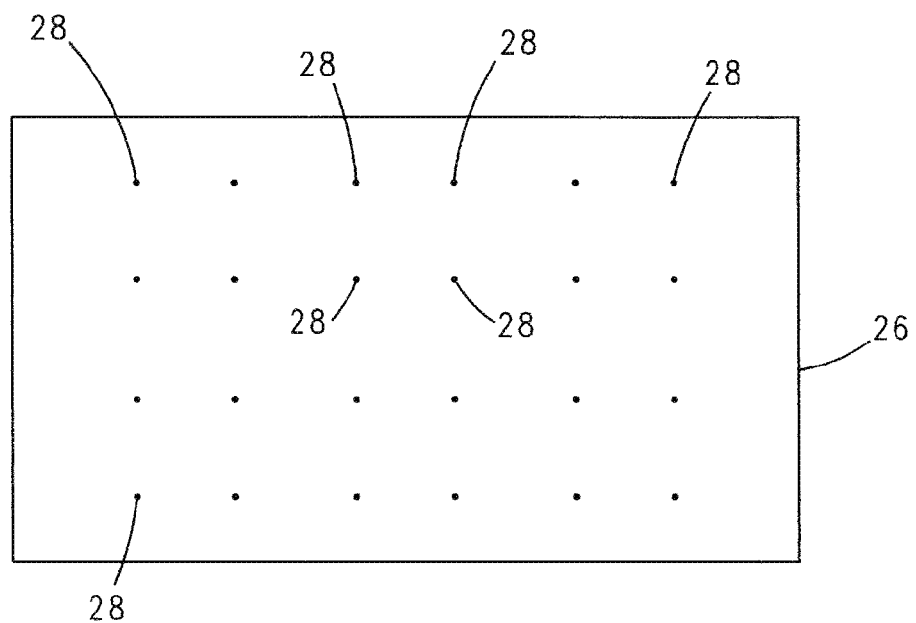
FIG. 7 is an isolated schematic plan view of the alignment substrate of FIG. 6 including a second set of alignment features.

In an example, the alignment features on frame 6 can be complementary with the corresponding alignment features 28 of alignment substrate 26. For example, each alignment feature 22 can be one of a ring (as shown in FIG. 6) or a filled-in circle and each alignment feature 28 can be the other of a filled-in circle (also as shown in FIG. 6) or a ring. Different styles or shapes of alignment features 22 and 28, complementary or not, are envisioned.

Once controller 20 has determined that the first and second sets of alignment features 22 and 28 are aligned, controller causes alignment stage 12 to lower pins 14 thereby returning the combination frame and shadow mask 6/8 from the position shown in FIG. 9 back to the position shown in FIG. 8 with the frame 6 in contact with the first side of carrier 2. Thereafter, each combination frame and shadow mask 6/8 is secured to carrier 2 in any suitable and/or desirable manner, such as, for example, by adhesive or welding, to form finished assembly 25.

With reference to FIGS. 10-14 and with continuing reference to all previous figures, in a third example multi-mask alignment system, alignment substrate 26 includes light receivers 34 (in place of the second set of alignment features 28 on the alignment substrate 26 of the second example multi-mask alignment system) and carrier 2 is provided with a second set of alignment features 30. It is to be appreciated that alignment features 28 of alignment substrate 26 (in the second example multi-mask alignment system) and alignment features 30 of carrier 2 (in this third example multi-mask alignment system) are each used independently with the first set of alignment features 22 of the combination frame and shadow mask 6/8. Optional support frames 38 (shown in phantom) can be included on carrier 2 for supporting light receivers 34 to avoid sagging of carrier 2 due to the added weight of light receivers 34.

In an example, either one or both of the first and second sets of alignment features 22 and 30 can be holes. If desired, the holes of the first and/or second sets of alignment features 22 and 30 can be filled with a light transmissive material.

Light sources 32 (FIGS. 13 and 14) can be positioned on the second (bottom) side of carrier 2 opposite the combination frame and shadow mask 6/8. In an example, each light receiver 34 (e.g., a photodiode) disposed on alignment substrate 26 is configured to be aligned with the light output from one of the light sources 32 (e.g., an LED) thereby defining a light source-light receiver pair 32/34. Each light source-light receiver pair 32/34 defines therebetween a light path 36. In an example, one alignment feature 22 of the first set of alignment features 22 and one alignment feature 30 of the second set of alignment features 30 are positioned along each light path 36.

In this example, controller 20 is operative for processing the outputs of light receivers 34 and, based on the processed outputs of light receivers 34, for causing the alignment stage 12 to adjust a position of the combination frame and shadow mask 6/8 to fine or precision align the one alignment feature 22 of the first set of alignment features and the one alignment feature 30 of the second set of alignment features in each light path 36. In this example, controller 20 and light receivers 34 define a control system.

For the purpose of this description, it will be assumed that a single alignment stage 12 of alignment system 10 and a plurality of light source-light receiver pairs 32/34 defining light pairs 36 are utilized for fine or precision alignment of a single combination frame and shadow mask 6/8. In a particular example, four light source-light receiver pairs 32/34 defining four light paths 36 are utilized for fine or precision alignment of a single combination frame and shadow mask 6/8. However, this is not to be construed in a limiting sense.

Figure 13:
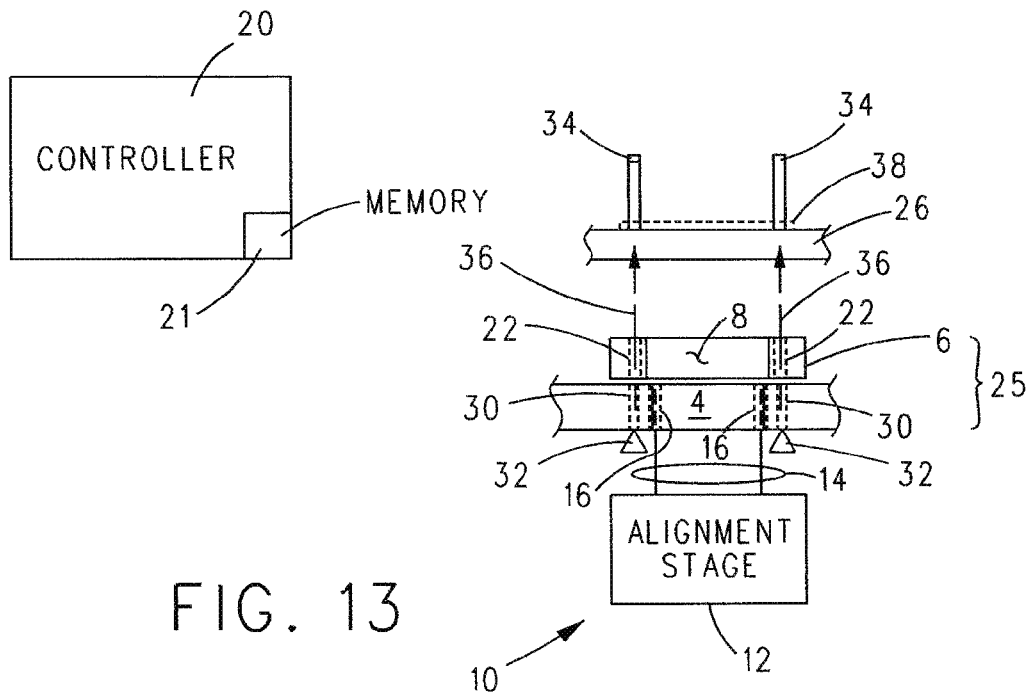
FIG. 13 is a view taken along lines XIII-XIII in FIG. 12 of the alignment substrate including light receivers positioned over a combination frame and shadow mask disposed on a top surface of the carrier frame shown in FIG. 10 and light sources positioned under the carrier frame.
Figure 14:
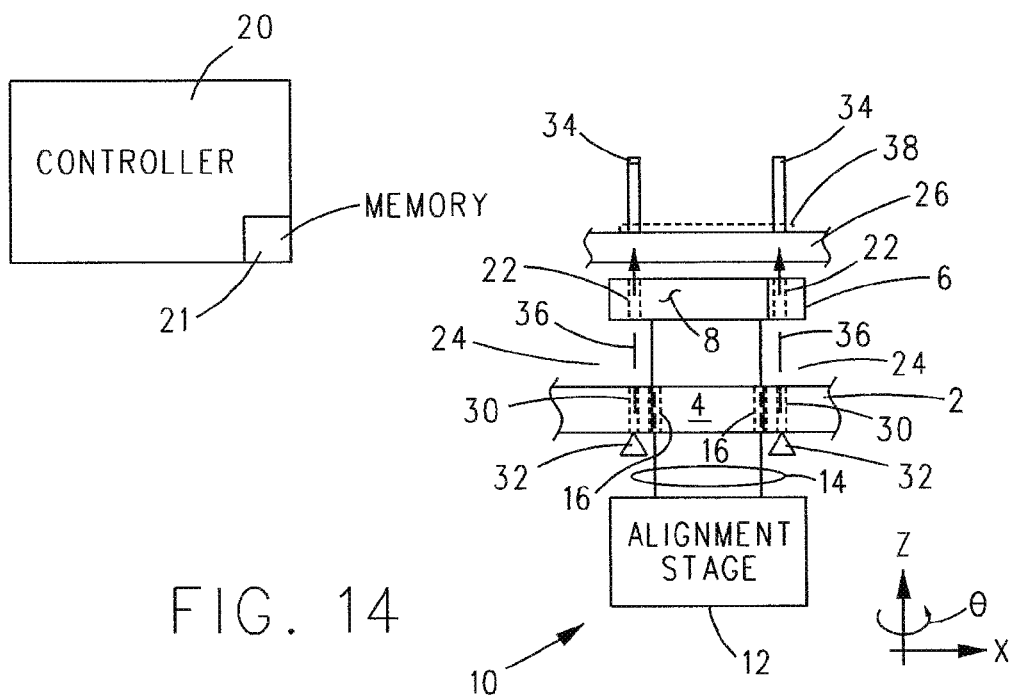
FIG. 14 is a view of the multi-mask alignment system shown in FIG. 13 with the combination frame and shadow mask lifted above the top surface of the carrier frame via the pins of alignment stage of the alignment system.

At a suitable time, controller 20 causes alignment stage 12 to extend pins 14 from the retracted position shown in FIG. 13 to the extended position shown in FIG. 14 thereby forming gap 24. Then, with light sources 32 on, controller causes alignment stage 12 to move the combination frame and shadow mask 6/8 in the X, Y and/or θ directions as necessary to fine or precision align the first set of alignment features 22 to the corresponding second set of alignment features 30 (wherein one alignment feature 22 of the first set of alignment features and one alignment feature 30 of the second set of alignment features lie along each light path 36 as shown) until a predetermining amount of light is received by the light receivers 34 used for aligning said combination frame and shadow mask 6/8.

Once controller 20 has determined, via the outputs of light receivers 34, that the fine or precision alignment of the combination frame and shadow mask 6/8 is complete, controller 20 causes alignment stage 12 to return the combination frame and shadow mask 6/8 from the position shown in FIG. 14 back to the position shown in FIG. 13, with frame 6 in contact with the first side of carrier 2. Thereafter, each combination frame and shadow mask 6/8 is secured to carrier 2 in any suitable or desirable manner, such as, for example, adhesive or welding frame 6 to carrier 2, to form finished assembly 25.

Figure 15:
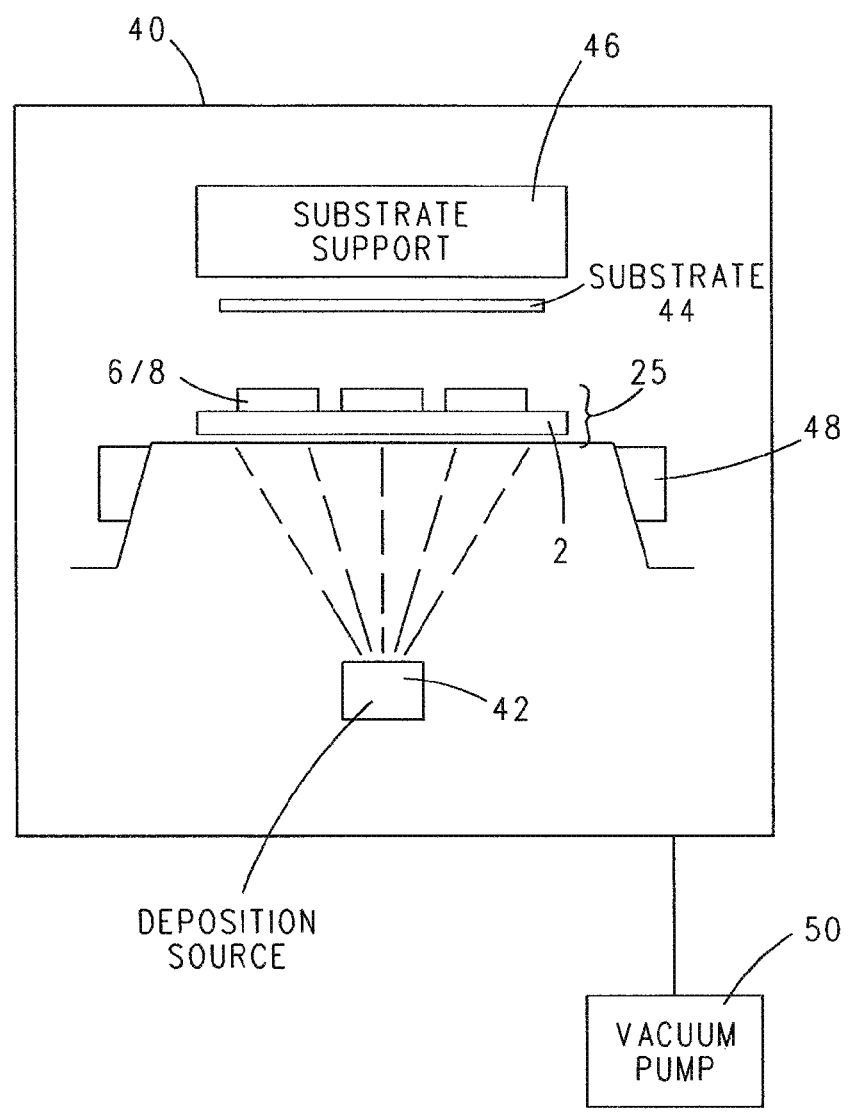
FIG. 15 is a schematic view of a shadow mask vapor deposition chamber including a finished assembly that includes plural combination frames and shadow masks fine or precision aligned on the carrier frame in one of the manners disclosed herein.

With reference to FIG. 15, once finished assembly 25 has been prepared in any of the manners described in the foregoing examples, finished assembly 25 can be placed inside of a deposition vacuum vessel 40 between a deposition source 42 and a substrate 44 which is supported by a substrate support 46. Deposition vacuum vessel 40 can also include an alignment system 48 which can be utilized to align finished assembly 25 and, hence, the shadow masks 8 thereof, to substrate 44. A vacuum pump 50 can be used to evacuate deposition vacuum vessel 40 to a suitable pressure for performing a vapor deposition event therein.

Deposition source 42 is charged with a desired material to be deposited onto substrate 44 via the one or more openings in each shadow mask 8 which is held in intimate contact with a portion of substrate 44 during a deposition event. The one or more openings of each shadow mask 8 correspond to a desired pattern of material to be deposited on substrate 44 from deposition source 42.

The illustration and discussion of finished assembly 25 inside of deposition vacuum vessel 40 is for the purpose showing but one example of the use of finished assembly 25 to perform vapor deposition events through the shadow masks 8 thereof. However, this is not to be construed in a limiting sense.

The embodiments have been described with reference to various examples. Modifications and alterations will occur others upon reading and understanding the foregoing examples. Accordingly, the foregoing examples are not to be construed as limiting the disclosure.

The invention claimed is:

1. A multi-mask alignment method, comprising:
   (a) providing a carrier having a plurality of apertures therethrough;
   (b) providing plural shadow mask-frame combinations on a first side of the carrier, wherein each shadow mask-frame combination includes a first set of alignment features, each shadow mask-frame combination positioned on the first side of the carrier with the frame supporting the shadow mask in alignment with one of the apertures;
   (c) providing an alignment system on a second side of the carrier opposite the first side;
   (d) providing a control system including a programmed controller; and
   (e) under the control of the controller, causing the alignment system to adjust the X, Y, and/or θ position of each shadow mask-frame combination from the second side of the carrier with respect to the carrier based on positions of the first set of alignment features for each shadow mask-frame combination determined by the controller.

2. The method of claim 1, further including:
   (f) following step (e), securing each shadow mask-frame combination to the carrier.

3. The method of claim 2, further including:
   (g) following step (f), performing vapor deposition through each shadow mask.

4. The method of claim 1, wherein the control system includes a digital camera positioned on the first side of the carrier and step (e) includes causing the alignment system to adjust the position of each shadow mask-frame combination based on images of the at least one shadow mask-frame combination acquired from the camera by the controller such that the first set of alignment features are aligned to a predetermined set of coordinates stored in a memory of the controller.

5. The method of claim 1, further including providing an alignment substrate including a second set of alignment features on a side of the plural shadow mask-frame combinations opposite the carrier, wherein step (e) includes causing the alignment system to adjust the position of each shadow mask-frame combination to align the second set of alignment features of alignment substrate and the first set of alignment features of each shadow mask-frame combination.

6. The method of claim 5, wherein the control system further includes one of the following:
   a digital camera operative for acquiring and forwarding digital images of the first and second sets of alignment features to the controller for processing during step (e); or
   plural light source-light receiver pairs, each said pair defining a light path, wherein one alignment feature of the first set of alignment features and one alignment feature of the second set of alignment features are positioned in each light path, and the controller is operative for processing the outputs of the light receivers during step (e).

7. The method of claim 5, wherein each alignment feature is one of the following: a visual mark or a hole.

8. The method of claim 5, wherein the alignment substrate is transparent.

* * * * *